United States Patent
Moro

(10) Patent No.: US 8,732,554 B2
(45) Date of Patent: May 20, 2014

(54) DATA STORAGE DEVICE AND METHOD FOR CHECKING AND CORRECTING ERRORS

(75) Inventor: Hiroyuki Moro, Hachioji (JP)

(73) Assignee: Kabushiki Kaisha Toshiba, Tokyo (JP)

(*) Notice: Subject to any disclaimer, the term of this patent is extended or adjusted under 35 U.S.C. 154(b) by 135 days.

(21) Appl. No.: 13/301,649

(22) Filed: Nov. 21, 2011

(65) Prior Publication Data
US 2012/0216098 A1   Aug. 23, 2012

(30) Foreign Application Priority Data
Feb. 21, 2011 (JP) ................. 2011-034601

(51) Int. Cl.
*G11C 29/00* (2006.01)

(52) U.S. Cl.
USPC .......................................... 714/768

(58) Field of Classification Search
USPC .......... 714/702, 773, 763–764, 768–769, 784
See application file for complete search history.

(56) References Cited

U.S. PATENT DOCUMENTS

| 7,587,658 B1* | 9/2009 | Tong et al. | ................ 714/785 |
| 7,877,668 B2* | 1/2011 | Sugahara | ................ 714/764 |

FOREIGN PATENT DOCUMENTS

| JP | 06-075804 | 3/1994 |
| JP | 2007-304781 | 11/2007 |
| JP | 2009-134682 | 6/2009 |
| JP | 2009-211204 | 9/2009 |
| JP | 2010-108029 | 5/2010 |

OTHER PUBLICATIONS

Japanese Office Action mailed on Apr. 16, 2013 in connection with Application No. 2011-034601.

* cited by examiner

*Primary Examiner* — Shelly A Chase
(74) *Attorney, Agent, or Firm* — Knobbe, Martens, Olson & Bear, LLP

(57) ABSTRACT

According to one embodiment, a data storage device includes a read module, an ECC module, and a controller. The read module is configured to read data to be accessed and designation data designating the data, from nonvolatile memories. The ECC module is configured to perform an error check and correction process on the data and designation data read by the read module. The controller is configured to correct the designation data if the ECC module cannot correct the designation data and to perform an error detection process based on the designation data corrected.

18 Claims, 5 Drawing Sheets

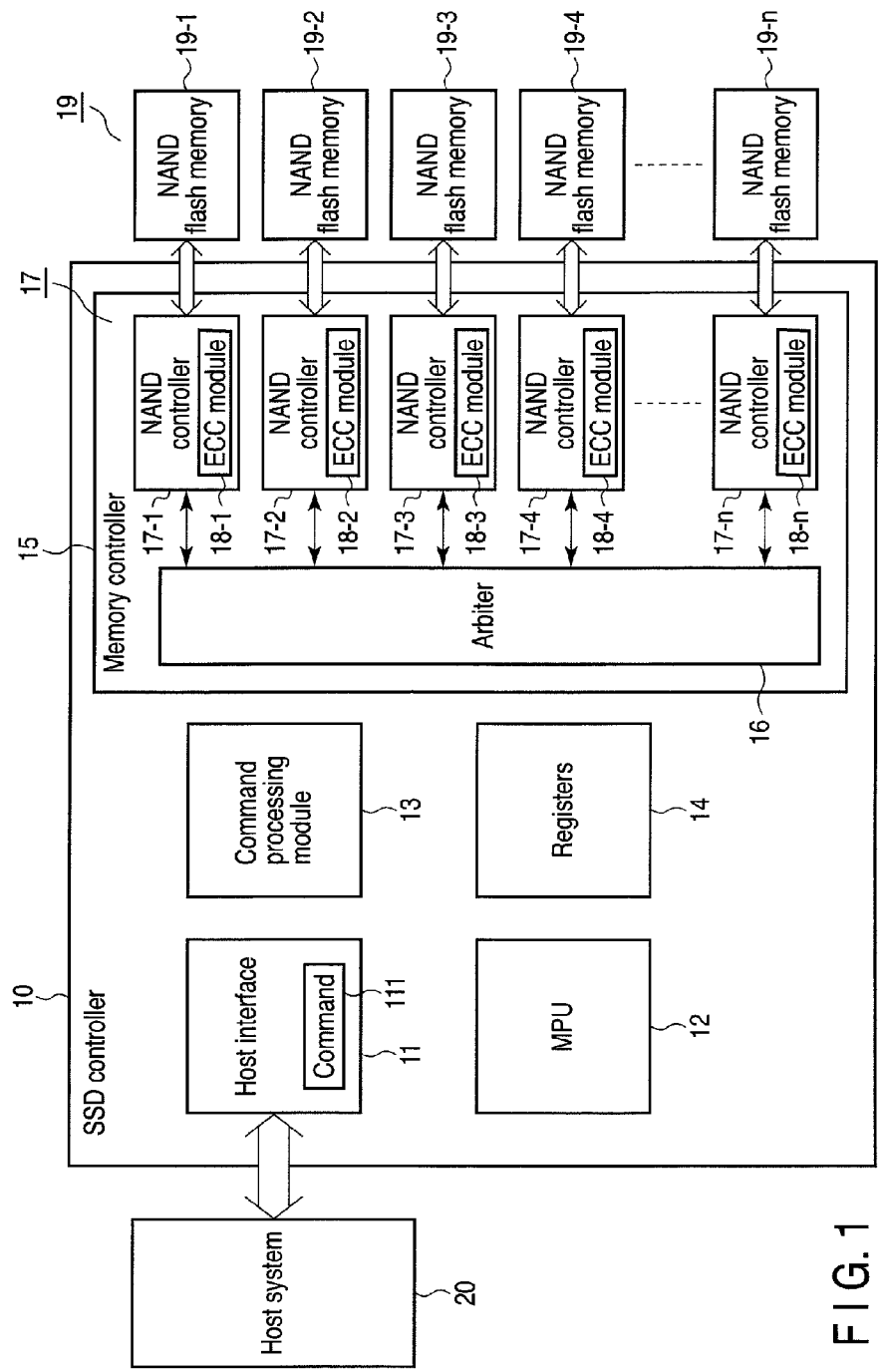
F I G. 1

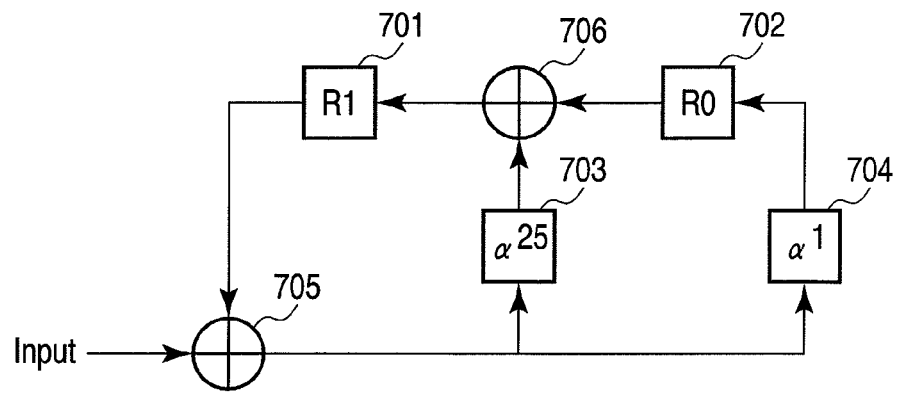
F I G. 7
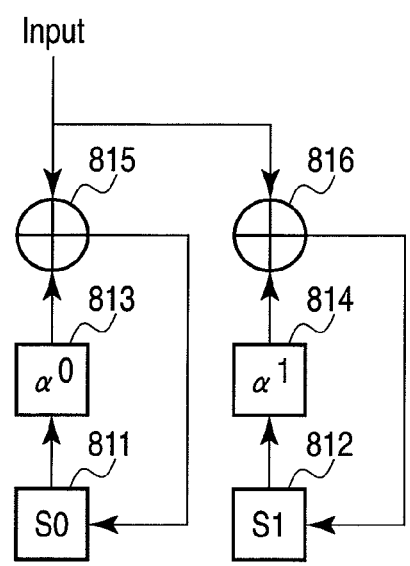
F I G. 8

DATA STORAGE DEVICE AND METHOD FOR CHECKING AND CORRECTING ERRORS

CROSS-REFERENCE TO RELATED APPLICATIONS

This application is based upon and claims the benefit of priority from prior Japanese Patent Application No. 2011-034601, filed Feb. 21, 2011, the entire contents of which are incorporated herein by reference.

FIELD

Embodiments described herein relate generally to a data storage device having nonvolatile memories and a method for checking and correcting errors.

BACKGROUND

In recent years, solid-state drives (SSDs) have been developed as data storage devices, each using NAND flash memories (hereinafter referred to as "flash memories" in some cases) that are rewritable nonvolatile memories.

The SSD is configured to perform an error check and correction (ECC) process before the data read from any flash memory is transferred to a host system provided. Hereinafter, the error check and correction (ECC) process will be referred to as "ECC process" in some cases.

The SSD transfers data in which no errors have been detected in the ECC process or data which has been corrected in the ECC process to the host system. The SSD performs the ECC process not only on the data to be accessed in a read process (also known as "user data"), but also on data such as logical block addresses (LBAs) contained in a data format of specific units (e.g., sectors).

In the SSD, an error correction process is performed on any errors detected in the ECC process. The error correction process has a prescribed error correction capability. If too many errors for this capability are detected, they cannot be corrected. Assume that at most eight error bits, if detected in the user data and LBAs, can be corrected. Then, the data cannot be corrected if 9 error bits are detected in the data.

If it is determined that the data cannot be corrected, the data is read again from the flash memory, and the ECC process is again performed on the data. The ECC process performed again will decrease the read efficiency of the SSD.

BRIEF DESCRIPTION OF THE DRAWINGS

A general architecture that implements the various features of the embodiments will now be described with reference to the drawings. The drawings and the associated descriptions are provided to illustrate the embodiments and not to limit the scope of the invention.

FIG. 1 is a block diagram explaining the configuration of a data storage device according to an embodiment;

FIG. 7 is a diagram showing an ECC encoder according to the embodiment; and

FIG. 8 is a diagram showing an ECC decoder according to the embodiment.

DETAILED DESCRIPTION

Figure 2:
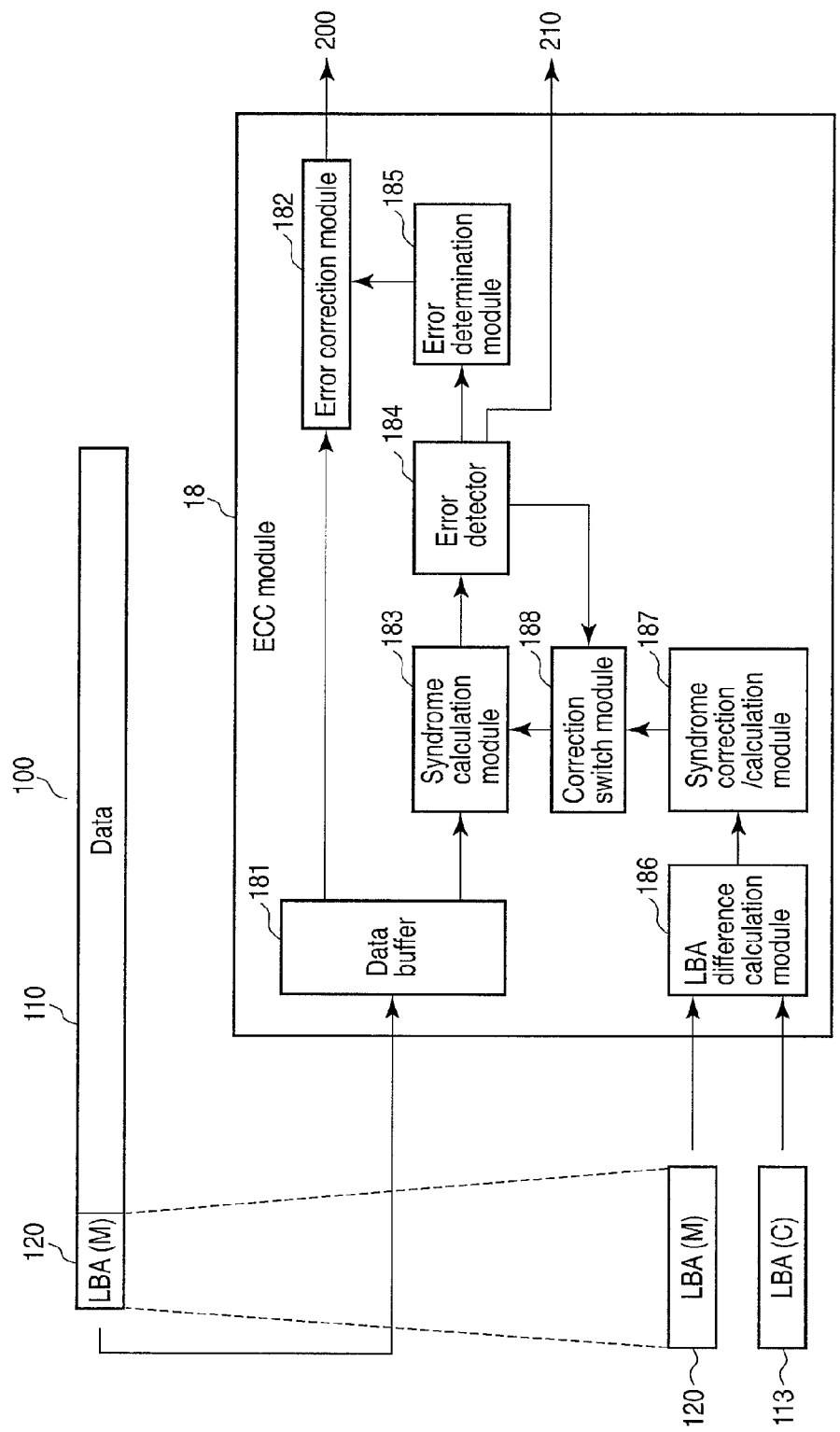
FIG. 2 is a block diagram explaining the configuration of an ECC module according to the embodiment.

Various embodiments will be described hereinafter with reference to the accompanying drawings.

In general, according to one embodiment, a data storage device includes a read module, an ECC module, and a controller. The read module is configured to read data to be accessed and designation data designating the data, from nonvolatile memories. The ECC module is configured to perform an error check and correction process on the data and designation data read by the read module. The controller is configured to correct the designation data if the ECC module cannot correct the designation data and to perform an error detection process based on the designation data corrected.

[Configuration of the Data Storage Device]

FIG. 1 is a block diagram showing the configuration of a data storage device according to an embodiment.

As shown in FIG. 1, the data storage device according to the embodiment is a solid-state drive (SSD) and has, in the main, an SSD controller 10 and NAND flash memories (flash memories) 19. The flash memories 19 are data storage media of the SSD. They are flash memories 19-1 to 19-$n$ associated with a plurality of channels, respectively.

The SSD controller 10 has a host interface 11, a microprocessor (MPU) 12, a command processing module 13, registers 14, and a flash memory controller (hereinafter referred to as "memory controller") 15.

The host interface 11 is an interface for the SSD and a host system (e.g., personal computer) 20, and is configured to control the transfer of data and commands to and from the host system 20. In response to an access request coming from the host system 20, the host interface 11 generates a command 111 of such a form a as will be described later, and transfers the command 111 to the MPU 12.

The MPU 12 is connected by a system bus (not shown) to the host interface 11, command processing module 13, registers 14 and memory controller 15, and is configured to perform various controls. The MPU 12 sets, to the registers 14, commands, data, values, etc., which are necessary for various controls.

The command module 13 is configured to interpret the command 111 the MPU 12 has set to the registers, and to issue commands, such as read command and write command, to the memory controller 15.

The memory controller 15 has an arbitration module (hereinafter referred to as "arbiter") 16 and a NAND controller 17. The NAND controller 17 is configured to control the flash memories 19 in a write process, a read process and an erase process. The NAND controller 17 comprises NAND controllers 17-1 to 17-$n$ associated with the channels, respectively, and configured to control the flash memories 19-1 to 19-$n$, respectively. The NAND controllers 17-1 to 17-$n$ have error check and correction modules (hereinafter referred to as "ECC modules") 18-1 to 18-$n$, respectively. Further, each NAND controller has a read module (not shown) that performs a read process of reading data from the flash memory (i.e., memory 19-1, 19-2, . . . , or 19-$n$) associated with the NAND controller.

The write process performed in the SSD according to this embodiment is of multi-channel type, in which data is written in parallel to the flash memories 19-1 to 19-$n$ of the respective channels. The write process performed on the flash memories is also known as "programming."

The arbiter 16 is connected to the NAND controllers 17-1 to 17-n and is configured to adjust the timing of the write process, read process and erase process. The arbiter 16 is also configured to adjust the transfer of commands and data to the NAND controllers 17-1 to 17-n.

FIG. 2 is a block diagram showing the configuration of one of the ECC modules 17-1 to 17-n. Note that the ECC modules 17-1 to 17-n are identical in configuration. For the sake of convenience, FIG. 2 shows an ECC module 18 as representative of the ECC modules 17-1 to 17-n.

As shown in FIG. 2, the ECC module 18 has a data buffer 181, an error correction module 182, a syndrome calculation module 183, an error detector 184, an error determination module 185, an LBA difference calculation module 186, a syndrome correction/calculation module 187, and a correction switch module 188.

The data buffer 181 holds data 100 read from a flash memory 19 in units of sectors and outputs the data 100 to the error correction module 182 and syndrome calculation module 183. The data 100 has user data 110 and a logical block address (LBA) 120. After preparation has been made for error correction, the error correction module 182 corrects errors (error bits) in the data output from the data buffer 181 in accordance with the data output from the error determination module 185.

The syndrome calculation module 183 calculates syndrome from the data supplied from the data buffer 181. The syndrome is information from which the positions of errors are calculated. The error detector 184 uses the syndrome calculated in the syndrome calculation module 183, and judges if there are any errors. That is, the error detector 184 determines whether the data contains errors and outputs an error decision 210. The error decision 210 is transferred to the MPU 12 through the arbiter 16. If errors are detected in the data, the error detector 184 will transfer the syndrome to the error determination module 185.

The error determination module 185 determines the position of errors on the basis of the syndrome transferred from the error detector 184 and generates error position data representing the position. The error position data is output to the error correction module 182. The error correction module 182 corrects the data and outputs corrected data 200.

The LBA difference calculation module 186 receives the LBA (value M) 120 contained in the data 100 read from the flash memory 19 and an LBA (value C) 113 supplied as argument of a read command. Then the LBA difference calculation module 186 calculates the difference between the LBA 120 and the LBA 113 and outputs the LBA difference to the syndrome correction/calculation module 187. The LBA (value C) 113 has been generated by the host interface 11 as will be described later, and is a logical block address contained in the command format set in the registers 14.

The syndrome correction/calculation module 187 calculates a correction value for the syndrome calculated by the syndrome calculation module 183, on the basis of the information (i.e., LBA difference) output from the LBA difference calculation module 186. If the data should be corrected (correction-on), the correction switch module 188 outputs the correction value to the syndrome calculation module 183. To be more specific, the correction switch module 188 receives correction on/off instruction coming from the error detector 184, and outputs the correction value if the instruction is "correction-on," and does not output the correction value if the off instruction is "correction-off."

If the error detector 184 judges that the data has too many errors to correct in the error correction module 182, it gives "correction-on" instruction to the correction switch module 188. Conversely, if the error detector 184 judges that the data has fewer errors the error correction module 182 can correct. In this case, the error detector 184 gives "correction-off" instruction to the correction switch module 188. Note that the error correction module 182 can correct at most 8 error bits detected in the data 100. Therefore, if the error detector 184 concludes that there are 9 or more error bits in the data 100, it is determined that the error correction module 182 cannot correct the data 100.

[ECC Process]

Figure 6:
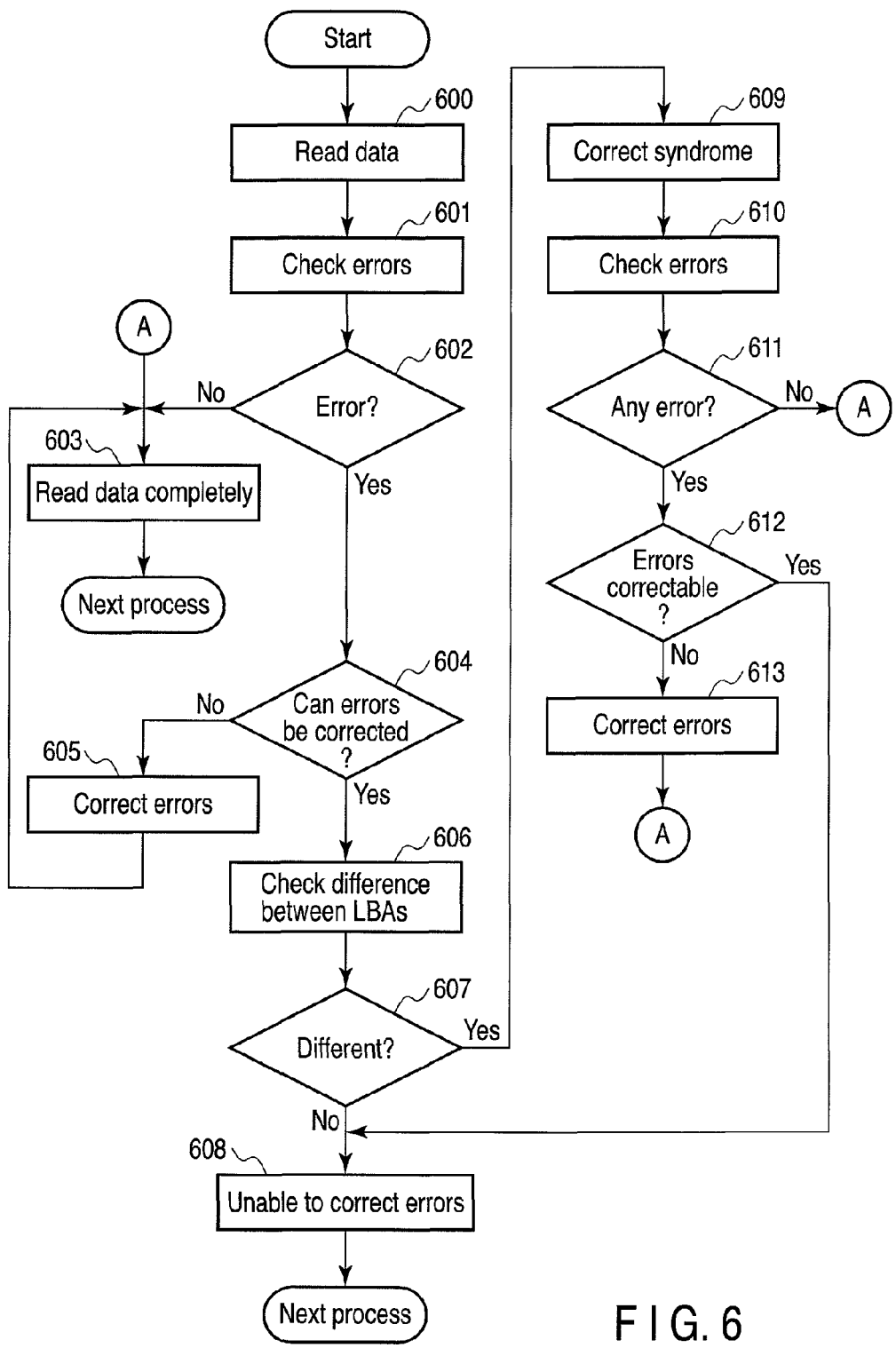
FIG. 6 is a flowchart explaining the sequence of an ECC process according to the embodiment.

How the ECC process is performed in this embodiment will be explained with reference to the flowchart of FIG. 6.

In the SSD, the NAND controllers 17-1 to 17-n read the LBA data (value M) designated by the LBA (value C), respectively from the flash memories 19-1 to 19-n, in accordance with a read command issued by the command module 13 (Block 600). The ECC modules 18-1 to 18-n perform the ECC process on the data read from the flash memories 19-1 to 19-n. How data is read and how the ECC process is performed for one channel will be explained, for the sake of simplicity.

Figure 3:
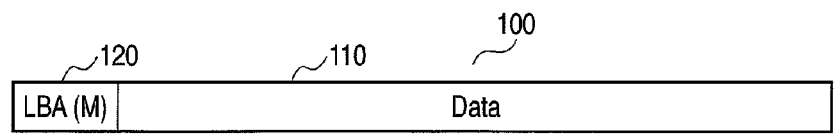
FIG. 3 is a diagram explaining a data format according to the embodiment.
Figure 4:
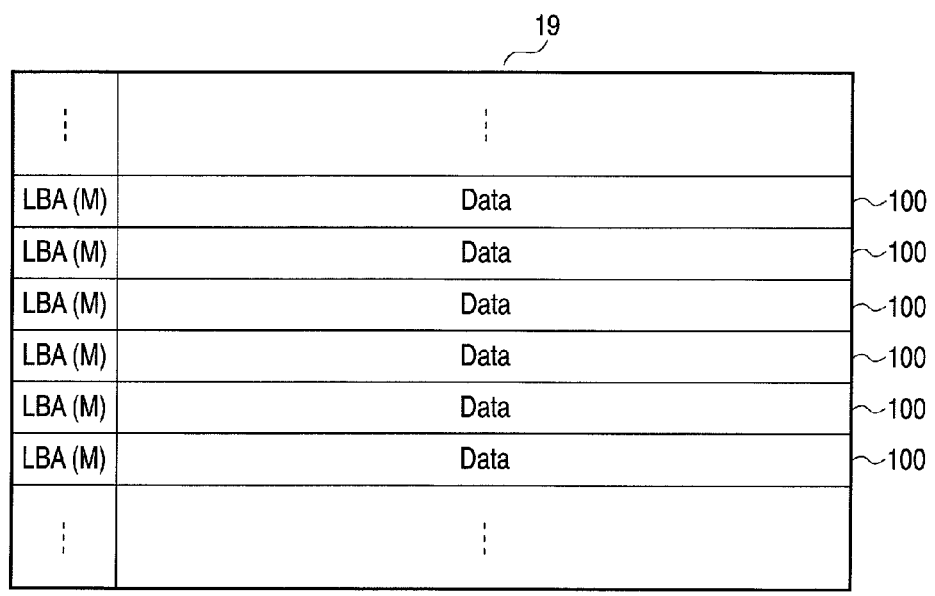
FIG. 4 is a diagram explaining the state in which data is stored in the flash memories according to the embodiment.

FIG. 3 is a diagram explaining a data format 100. As FIG. 3 shows, the data format 100 of one entry (e.g., one sector) is composed of user data 110 and LBA (M) 120. The user data 110 is data to be accessed from the host system 20. The LBA (M) 120 is designation data designating the user data 110, and is address data representing a storage position in the flash memory 19. As shown in FIG. 4, the flash memory 19 stores data items of data format 100, which are neatly arranged.

Figure 5:
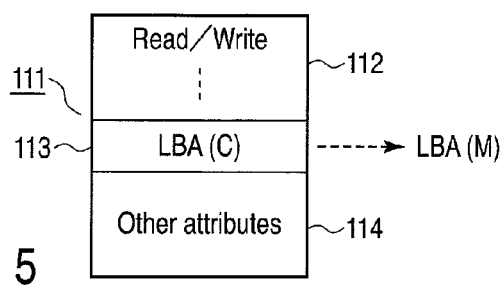
FIG. 5 is a diagram explaining a command format according to the embodiment.

FIG. 5 shows the format of a command 111 issued by the command module 13 and used in the SSD controller 10. The command format is composed of flag 112, LBA (C) 113 and data 114. The flag 112 designates either the reading of data from the flash memory 19 or the writing of data to the flash memory 19. The LBA (C) 113 designates data to be accessed. The data 114 represents other attributes.

The command 111 in which the flag 112 designates the reading of data is called "read command," for convenience. The LBA (C) 113 is associated with the LBA (M) 120 of the data format 100 stored in the memory 19. The LBA (C) 113 designates, as data to be accessed, the data 110 containing the LBA (M) 120 having value M equal to value C.

As seen from FIG. 2, the ECC module 18 receives the data 100 read from the flash memory 19 and stores the data 100 in the data buffer 181. The syndrome calculation module 183 calculates a syndrome for the data read from the data buffer 181. The syndrome is output to the error detector 184. The error detector 184 uses the syndrome, detects errors, and outputs an error decision 210 (Block 601).

If the error detector 184 outputs an error decision 210 indicating that the data has no errors (NO in Block 602), the NAND controller 17 determines that the data has been completely read (Block 603). In most cases, the NAND controller 17 has a buffer for storing the data read. When the NAND controller 17 finishes reading data in units of clusters (e.g., eight sectors), the memory controller 15, it transfers the data to the host interface 11.

If the error detector 184 detects errors, it determines whether the error correction module 182 can correct the errors on the basis of the error correction capability of the error correction module 182 (Block 604).

If the error detector 184 determines that the error correction module 182 can correct the errors (YES in Block 604), the error correction module 182 corrects the errors and outputs the corrected data (Block 605). At this point, the error correction module 182 corrects the errors as described above, in accordance with the error position data coming from the error determination module 185. When the error correction module 182 finishes correcting the errors, the NAND controller 17 determines that the read process has been completed (Block 603).

If the error detector 184 determines that the error correction module 182 cannot correct the errors, the LBA difference calculation module 186 receives the LBA (M) 120 contained in the data 100 read from the flash memory 19 and the LBA (C) 113 of the read command. The LBA difference calculation module 186 then calculates the difference between the LBA (M) 120 and the LBA (C) 113 (Block 606).

If there is no difference, proving that the LBA (M) 120 and the LBA (C) 113 are identical (NO in Block 607), the LBA (M) is found to have no errors. In this case, the ECC module 18 terminates the ECC process because the errors cannot be corrected (Block 608). That is, the ECC module 18 of this embodiment performs an error detection process again after the syndrome of the LBA (M) has been corrected. If the LBA (M) has no errors, the result of this error detection process remains the same, and the errors can no longer be corrected. The ECC process is therefore terminated.

Assume that the LBA difference calculation module 186 finds a difference (YES in Block 607). Then, the LBA (M) is found to have error bits. In this case, the syndrome correction/calculation module 187 corrects the syndrome calculated in the syndrome calculation module 183, on the basis of the difference calculated by the LBA difference calculation module 186 (Block 609). More specifically, the syndrome correction/calculation module 187 calculates a correction value that will correct the syndrome containing error bits, changing the syndrome to a syndrome based on the LBA (C).

If the error detector 184 determines that the errors cannot be corrected, it gives "correction-on" instruction to the correction switch module 188. On receiving the instruction, the correction switch module 188 outputs the correction value calculated by the syndrome correction/calculation module 187, to the syndrome calculation module 183.

The syndrome calculation module 183 holds the syndrome it has calculated first, and replaces that part of the this syndrome which corresponds to the LBA (M), with the correction value output from the correction switch module 188. The syndrome containing the correction value is output to the error detector 184. The error detector 184 uses the syndrome containing the correction value, performing the error detection process again (Block 610).

If the error detector 184 outputs an error decision 210 showing that the data has no errors (NO in Block 602), the NAND controller 17 determines that the data has been completely read (Block 603). On the other hand, if the error detector 184 detects errors, it determines whether the errors can be corrected or not (Block 612).

If the error detector 184 determines that the errors can be corrected (YES in Block 612), the error correction module 182 corrects the errors, and outputs the error-free data (Block 613). If the error detector 184 determines that the errors cannot be corrected (NO in Block 612, the ECC module 18 terminates the ECC process (Block 608).

As described above, if the errors in the data 100 read from the flash memory 19 are found unable to be corrected in the ECC process, the error detection process is performed again on the basis of the LAB (C). More precisely, the correction value obtained by correcting the syndrome for the LBA (M) is used, performing the error detection process again.

If this method finds that the errors cannot be corrected, the error detection process can be efficiently performed again, without the necessity of reading the data 100 again. The ECC process can therefore be performed again at high efficiency. This ultimately increases the efficiency of the read process.

Assume that the error correction module 182 can correct, for example, eight error bits at most. Then, the error correction module 182 cannot correct the data if the user data 110 has eight error bits and the LBA (M) has 1 error bit. In this case, it is more probably determined that the data can be corrected if errors are detected in it after the LBA (M) has been corrected. As a result, it will be more probable that 8 or more error bits, if any, can be corrected, in spite of the limited correction capability of the ECC module 18.

The method according to this embodiment can efficiently achieve also a process of collecting statistical data indicating an increase in the number of error bits in the flash memory 19.

The embodiment may be so modified that the LBA (M) is corrected after the LBA (C) has been corrected, and is then used together with the user data to calculate the syndrome again. In this method, however, the user data 110 must be read again from the data buffer 181.

[ECC Encoder and ECC Decoder]

FIG. 7 is a function block diagram showing an ECC encoder according to the embodiment.

In the read process, ECC module 18 uses an error correction code generated by an ECC encoder to perform the above-mentioned ECC process. In the write process of writing data to the flash memory 19, the ECC encoder uses data containing the LBA (A) and user data, generating an error correction code.

As shown in FIG. 7, the ECC encoder has data holding elements 701 and 702, Galois field multipliers 703 and 704, and Galois field adders 705 and 706. The data holding elements 701 and 702 are, for example, flip-flops. In the instance of FIG. 7, the data holding elements 701 and 702 hold code values R1 and R0, respectively. The multipliers 703 and 704 are an $\alpha^{25}$ multiplier and an $\alpha^1$ multiplier, respectively.

The ECC encoder generates RS codes (255, 253 and 1) on GF ($2^8$), which can correct one symbol in a code having length of 255 symbols and expressed by the following formula (1). The RS codes are Reed-Solomon codes.

$$X^2 + \alpha^{25} + \alpha \quad (1)$$

Note that the syndrome generators are X−1 and X−α.

The ECC encoder receives data in units of symbols, each symbol at one clock signal, and generate, as error correction codes, the code values R1 and R0 held in the data holding elements 701 and 702, respectively, when it completely receives the input data.

FIG. 8 is a function block diagram showing an ECC decoder according to the embodiment, which is associated with the ECC encoder shown in FIG. 7.

The ECC decoder shown in FIG. 8 is configure to implement the function of the syndrome calculation module 183 or syndrome correction/calculation module 187 of the ECC module 18. As shown in FIG. 18, the ECC decoder has a data holding elements 811 and 812, Galois field multipliers 813 and 814, and Galois field adders 815 and 816.

The data holding elements 811 and 812 are, for example, flip-flops. In the instance of FIG. 8, the hold syndrome values S1 and S0, respectively. The multipliers 813 and 814 are an $\alpha^0$ multiplier and an $\alpha^1$ multiplier, respectively.

The ECC decoder generates RS receive input data in units of symbols, each symbol at one clock signal. When the ECC decoder finishes receiving the input data, it outputs values S0 and S1 held in the data holding elements 811 and 812, respectively, as syndrome. As seen from FIG. 8, the syndrome values S1 and S0 have been independently calculated. They therefore do not influence each other. If the values held in the data holding elements 811 and 812 are both "0," it will be determined that there are no errors.

The value S0 held in the data holding element 811 is calculated by using the following equation (2):

$$S0 = I_0(\alpha^0)^n + I_1(\alpha^0)^{(n-1)} + I_2(\alpha^0)^{(n-2)} + \ldots + I_n \quad (2)$$

where $I_0, I_1, I_2, \ldots, I_n$ are input data to be decoded.

The value S0 held in the data holding element 811 is calculated by using the following equation n(3):

$$S1 = I_0(\alpha^1)^n + I_1(\alpha^1)^{(n-1)} + I_2(\alpha^1)^{(n-2)} + \ldots + I_n \quad (3)$$

In the syndrome correction/calculation module 187, the syndrome is corrected by exchanging those terms of the input data, which differ in LBA (M) and LBA (C).

If the input data $I_2$ differ, the terms $I_2(\alpha^0)^{(n-2)}$ and $I_2(\alpha^1)^{(n-2)}$ are subtracted from equations (2) and (3), respectively, and terms $I_{2a}(\alpha^0)^{(n-2)}$ and $I_{2a}(\alpha^1)^{(n-2)}$ calculated from the value I2a that should be replaced is added to equations (2) and (3), respectively.

That is, the syndromes S0a and S1a corrected can be calculated as the following equations (4) and (5), by utilizing the fact that the subtraction of any Galois body is addition:

$$S0a = S0 - I_2(\alpha^0)^{(n-2)} + I_{2a}(\alpha^0)^{(n-2)} \quad (4)$$
$$= S0 + (I_2 - I_{2a})(\alpha^0)^{(n-2)}$$

$$S1a = S1 - I_2(\alpha^1)^{(n-2)} + I_{2a}(\alpha^1)^{(n-2)} \quad (5)$$
$$= S1 + (I_2 - I_{2a})(\alpha^1)^{(n-2)}$$

The values used to correct the syndromes S0 and S1 can easily be calculated as described above, merely by adding the product of the difference between the input data and $\alpha^0$ (position of the input data) to the product of this difference and the $\alpha^1$ (position of the input data).

The ECC encoder and ECC decoder shown in FIG. 7 and FIG. 8, respectively, have been described, for convenience, as those configured to process RS codes. Nonetheless, they are not limited in terms of configuration. They may be those configured to process, for example, Bose-Chaudhuri-Hocquenghem (BCH) codes.

The various modules of the systems described herein can be implemented as software applications, hardware and/or software modules, or components on one or more computers, such as servers. While the various modules are illustrated separately, they may share some or all of the same underlying logic or code. While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A data storage device comprising:
   a read module configured to read user data specified by a logical address of a read command and designation data designating the user data, from a nonvolatile memory;
   an error check and correction (ECC) module configured to perform an error detection and correction process on the user data and the designation data read by the read module; and
   a controller configured to correct the designation data and to cause the ECC module to perform the error detection process again based on the corrected designation data, if the ECC module is unable to correct errors.

2. The data storage device of claim 1, wherein the ECC module is configured to calculate a syndrome for the user data and the designation data, and to perform a first error detection process in accordance with the calculated syndrome; and the controller is configured to correct the calculated syndrome for correcting the designation data, and to cause the ECC module to perform the error detection process again on the basis of the corrected syndrome.

3. The data storage device of claim 1, wherein the controller is configured to use a result of the error detection process performed again, causing the ECC module to perform the error correction process again.

4. The data storage device of claim 1, wherein the designation data is stored, as address data representing a storage position, in the nonvolatile memory.

5. The data storage device of claim 4, wherein the controller is configured to change the address data read by the read module to the logical address designated by a read command, thereby to correct the designation data.

6. The data storage device of claim 1, wherein the designation data is stored as address data in the nonvolatile memory; the ECC module is configured to calculate a syndrome for the user data and the address data and to perform the error detection process for the first time, on the basis of the calculated syndrome; and the controller is configured to calculate a difference between the address data read by the read module and the logical address designated by a read command, to correct the syndrome on the basis of the difference and to cause the ECC module to perform the error detection process again, on the basis of the corrected syndrome.

7. The data storage device of claim 1, wherein the controller is configured to determine that errors are unable to be corrected, if the ECC module is unable to correct errors and if no errors are detected in the corrected designation data.

8. The data storage device of claim 3, wherein the controller is configured to determine that errors are unable to be corrected, if the ECC module is unable to correct errors again.

9. The data storage device of claim 1, wherein the ECC module is configured to calculate a syndrome for the user data and the designation data and to perform a first error detection process on the basis of the calculated syndrome; and the controller is configured to calculate a syndrome again for the corrected designation data and the user data and to cause the ECC module to perform the error detection process again on the basis of the calculated syndrome.

10. A method of detecting errors, for use in a data storage device having a read module configured to read user data specified by a logical address of a read command and designation data designating the user data, from a nonvolatile memory, the method comprising:
    performing an error detection and correction process on the user data and the designation data read by the read module;
    correcting the designation data if the user data and the designation data are unable to be corrected in the error detection and correction process; and
    performing the error detection process again based on the corrected designation data.

11. The method of claim 10, wherein performing an error detection and correction process comprises calculating a syndrome for the user data and the designation data and performing the error detection process for the first time, on the basis of the calculated syndrome, the method further comprising correcting the calculated syndrome and performing the error detection process again, on the basis of the calculated syndrome.

12. The method of claim 10, further comprising:
using a result of the error detection process performed again; and
performing the error correction process again.

13. The method of claim 10, wherein the designation data is stored as address data representing a storage position in the nonvolatile memory, and correcting the designation data comprises changing the address data read by the read module to the logical address designated by a read command.

14. The method of claim 10, wherein the designation data is stored as address data in the nonvolatile memory, and performing the error detection process comprises calculating a syndrome for the user data and the designation data and performing the error detection process for the first time, on the basis of the calculated syndrome, and correcting the designation data comprises calculating a difference between the address data read by the read module and the logical address designated by a read command, correcting the syndrome on the basis of the difference and performing the error detection process again, on the basis of the corrected syndrome.

15. The method of claim 10, further comprising determining that errors are unable to be corrected, if the errors are not corrected in the error detection and correction process and if no errors are detected in the corrected designation data.

16. The method of claim 12, further comprising determining that errors are unable to be corrected, if not corrected in the error correction process performed again.

17. The method of claim 10, wherein performing an error detection and correction process comprises calculating a syndrome for the user data and the designation data and performing the error detection process for the first time, on the basis of the calculated syndrome, and further calculating again the syndrome for the corrected designation data and the user data and performing again the error detection process on the basis of the syndrome calculated again.

18. The method of claim 10, wherein in the error detection process, a syndrome is calculated for the user data and the designation data and the error detection process is performed for the first time, on the basis of the calculated syndrome, and further comprising calculating again the syndrome for the corrected designation data and the user data and performing again the error detection process on the basis of the syndrome calculated again.

* * * * *